(12) United States Patent
Paul et al.

(10) Patent No.: US 7,500,173 B2
(45) Date of Patent: Mar. 3, 2009

(54) METHOD OF DECODING A DATA WORD

(75) Inventors: Nicolas Paul, Paris (FR); Jérôme Brouet, Paris (FR); Jacques Antoine, Chatillon (FR); Lionel Husson, Meudon (FR); Armelle Wautier, Gif sur Yvette (FR); Jean-Claude Dany, Buc (FR)

(73) Assignee: ALCATEL, Paris (FR)

( * ) Notice: Subject to any disclaimer, the term of this patent is extended or adjusted under 35 U.S.C. 154(b) by 624 days.

(21) Appl. No.: 10/920,435

(22) Filed: Aug. 18, 2004

(65) Prior Publication Data

US 2005/0050433 A1      Mar. 3, 2005

(30) Foreign Application Priority Data

Sep. 1, 2003      (EP) ............................ 03292150

(51) Int. Cl.
*G06F 11/10* (2006.01)
*H03M 13/00* (2006.01)

(52) U.S. Cl. .................... 714/807; 714/786

(58) Field of Classification Search ............ 714/784, 714/752, 786, 800, 807
See application file for complete search history.

(56) References Cited

U.S. PATENT DOCUMENTS

| | | | | |
|---|---|---|---|---|
| 6,122,763 A | * | 9/2000 | Pyndiah et al. | ............. 714/755 |
| 6,145,110 A | * | 11/2000 | Khayrallah | ................. 714/752 |
| 7,069,496 B2 | * | 6/2006 | Fujita et al. | ................. 714/780 |

FOREIGN PATENT DOCUMENTS

GB      2 328 594 A      2/1999

OTHER PUBLICATIONS

Rosenthal, Joachim, AN algebraic decoding algorithm for convloutional codes, 1999, Progress in systems and control theory, vol. 25, (retrived from google.com), p. 1-18.*
Hoholdt et al., On the decoding of algebraic deometric codes, Nov. 1995, IEEE Ttrans. on Info. Theory, vol. 41, No. 6, p. 1589-1614.*
Wei et al., High speed Reed Solomon decoder for correcting errors and erasures, Aug. 1993, IEE Proceedings-I, vol. 140, No. 4, p. 246-254.*
J. Pieter M. Schalkwijk, et al., Syndrome Decoding of Binary Rate- ½ Convolutional Codes, IEEE Transactions on Communications, Sep. 9, 1976, pp. 977-985, vol. com-24, No. 9.
W. H. Buttner, et al., Trellis Decoding of Linear Block Codes, copyright 1998 IEEE, pp. 171-174, Department of Electrical and Electronic Engineering, University of Pretoria, South Africa.

(Continued)

*Primary Examiner*—Shelly A Chase
(74) *Attorney, Agent, or Firm*—Sughrue Mion, PLLC

(57) ABSTRACT

A method of decoding a received data word (r) having been transmitted over a radio communication channel, the corresponding sent data word (m) having been encoded as a code word (c), the method includes:

multiplying of the received data word by a parity-check matrix, and if the result of the multiplication is zero: performing an algebraic decoding of the received data word without error correction, otherwise performing an error correction by estimating the transmission error, subtracting the estimated error from the received data word, and performing an algebraic decoding of the result of the subtraction, wherein for estimation of the transmission error is used to identify an approximate location of potential errors and the Viterbi algorithm is only applied for these locations, thus avoiding iterations in error-free areas.

20 Claims, 4 Drawing Sheets

OTHER PUBLICATIONS

G. C. Clark et al, "Lin S; Costello DJ", 1981, NY, XP002266186, pp. 50-61.

A. J. Vinck et al, "Syndrome Decoding of Binary Rate- ½ Convulutional Coes", IEEE Transactions on Communications, IEEE, Inc., NY US vol. COM-24, No. Sep. 9, 1976, pp. 977-985, XP000758813.

R. E. Blahut, "Theory and Practice of Error Control Codes", XP002266183, pp. 376-383, Reading, US, 1983.

S. Lin et al, "Error Control Coding. Fundamentals and Applications", 1983, US, XP002266185 pp. 8-11.

G. C. Clark et al, "Error Correction Coding for Digital Communications", 1981, NY XP002266184, pp. 331-341.

Chinese First Office Action dated May 26, 2006.

Bernard Sklar: "Digital Communications: Fundamentals and Applications, Second Edition," Published by the Publishing House of Electronics Industry, Sep. 2002, pates 245-261.

* cited by examiner

METHOD OF DECODING A DATA WORD

The invention is based on a priority application EP 03292150.4 which is hereby incorporated by reference.

FIELD OF THE INVENTION

The present invention relates to the field of decoding, and more particularly without limitation, to Viterbi decoding and forward error correction.

BACKGROUND OF THE INVENTION

A commonly used method to decode convolutional codes is the Viterbi algorithm. The Viterbi algorithm essentially performs maximum likelihood decoding; it reduces the computational load by taking advantage of the special structure in the code trellis. The advantage of Viterbi decoding, compared with brute-force decoding, is that the complexity of a Viterbi decoder is not a function of the number of symbols in the code word sequence.

The algorithm involves calculating a measure of similarity, or distance, between the received signal at a certain time and all the trellis paths entering each state at that time. The Viterbi algorithm removes from consideration those trellis paths that could not possibly be candidates for the maximum likelihood choice. When two paths enter the same state, the one having the best metric is chosen; this path is called the surviving path. The early rejection of the unlikely path reduces the decoding complexity. Still the Viterbi algorithm is quite computationally expensive.

Further, the Viterbi convolutional decoding algorithm is used for forward error correction. The purpose of forward error correction (FEC) is to improve the capacity of a channel by adding some redundant information to the data being transmitted through the channel. The process of adding this redundant information is known as channel coding. Convolutional coding is a major form of channel coding. Convolutional codes operate on serial data, one or a few bits at a time. Convolutional encoding with Viterbi decoding is a FEC technique that is particularly suited to a radio communication channel.

The present invention aims to provide an improved method of decoding of a received data word.

SUMMARY OF THE INVENTION

These and other objects of the present invention are solved basically by applying the features laid down in the respective independent claims. Preferred embodiments of the invention are given in the dependant claims.

The present invention is first based on the fact that error corrective decoding is not always required when a data word is received. In order to determine whether error corrective decoding is or is not required, it is checked whether a received data word is error free (or has undetectable errors) or if the information message has no chance to be recovered, i.e. there are too many errors in the received data words.

If the received data word has no errors or undetectable errors decoding is performed without prior error correction. If the information message is not recoverable, the frame is rejected before decoding.

Yet, in most cases, the frames will have to be decoded. In these cases, the complexity reduction is achieved by performing the FEC in a much more efficient way than the classical decoding: the Viterbi algorithm is used to estimate the transmission errors rather than the information message. With this type of decoding, a vast majority of state to state iterations can be avoided in the error-free zones.

This approach has the advantage that computationally expensive error correction procedures can be prevented in case a determination is made for the received data word that it has no error, undetectable errors or too many errors.

This approach also has the advantage that when the FEC is required, some significant complexity reduction is achieved by avoiding a vast majority of state to state iterations during the Viterbi decoding One way of determining whether error correction is required or not is based on the parity-check matrix. The parity-check matrix is also referred to as check-matrix or control matrix in coding theory. A parity-check matrix H for a code C having a generator matrix G satisfies $GH^t=0$ as it is as such known in the prior art.

In accordance with a preferred embodiment of the invention the parity-check matrix is calculated once for a given encoding scheme and stored in the receiver. When a data word is received it is multiplied by the pre-calculated parity-check matrix in order to determine whether error correction is required or not.

In accordance with a further preferred embodiment of the invention the result of the multiplication of the received data word by the parity-check matrix is used in order to determine whether error correction is required or not.

If the number of non-null coefficients of the result of the multiplication of the received data word by the parity-check matrix is equal to zero, the received data word is error-free (or the error is not detectable) and the error correction is not required.

If the number of non-null coefficients of the result of the multiplication of the received data word by the parity-check matrix is above a certain threshold level, no error correction and no decoding is performed as the received data word is considered uncorrectable. This has the advantage that useless processing of the uncorrectable data word is avoided.

Otherwise, if the FEC has to be performed, the classical Viterbi algorithm can be used to estimate the original information message.

Yet, if the FEC has to be performed, the Viterbi algorithm can be used to estimate the transmission errors rather than the information message. The result of the multiplication of the received data word by the parity-check matrix gives an approximate location of potential errors and the Viterbi algorithm is only applied in these identified zones, thus avoiding many iterations in the error-free area.

Finally the estimated transmission errors are subtracted to the received data word and an algebraic decoding is performed to evaluate the sent information message.

The determination whether error correction is required or not and the fast error correction procedure are based on the parity-check matrix works for arbitrary convolutional code rates, such as convolutional code rates of ½, ⅓, ⅔ (see further examples below). Yet, in the case of a convolutional code of rate ½, some simple polynomial manipulations can also lead to the result of the multiplication of the received data word by the parity-check matrix. Indeed, it can be shown that, in case of a convolutional code rate of ½ the result of the received data word multiplied by the parity check matrix can be also obtained by using the simple polynomial manipulations described in annex 3.

BRIEF DESCRIPTION OF THE DRAWINGS

In the following preferred embodiments of the invention will be described in greater detail by making reference to the drawings in which.

DETAILED DESCRIPTION OF THE INVENTION

Figure 1:
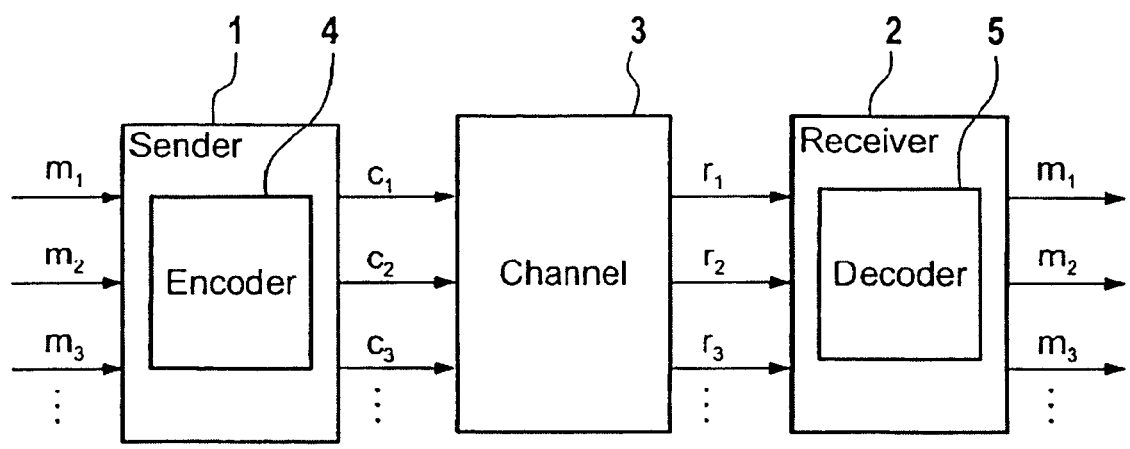
FIG. 1 is a block diagram of a telecommunication system.

FIG. 1 shows a telecommunication system having a sender 1 for sending of information messages $m_1, m_2, \ldots, m_k$ to a receiver 2 over channel 3. Sender 1 has encoder 4 for encoding of the information messages by means of a generator polynomials matrix $G=\{g_{ij}\}$ to provide encoded words $c_1, c_2, \ldots, c_n$. It is to be noted that the number of information messages k and the number n of encoded words can be arbitrary, i.e. the system works for various convolutional code rates k/n.

The encoded words $c_1, c_2, \ldots, c_n$, are transmitted over noisy channel 3. The transmission over noisy channel 3 results in the addition of errors $e_1, e_2, \ldots, e_n$. As a consequence receiver 2 receives messages $r_1, r_2, \ldots, r_n$, where $$r_1 = c_1 + e_1$$
$$r_2 = c_2 + e_2$$
$$\ldots$$
$$r_n = c_n + e_n$$

with $$c_1 = g_{11}m_1 + g_{12}m_2 + \ldots + g_{1k}m_k$$
$$c_2 = g_{21}m_1 + g_{22}m_2 + \ldots + g_{2k}m_k$$
$$\ldots$$
$$c_n = g_{n1}m_1 + g_{n2}m_2 + \ldots + g_{nk}m_k$$

Decoder 5 of receiver 2 has an error correction capability in order to eliminate the error vector $\{e_1, e_2, \ldots, e_n\}$ from the received messages to provide the original information messages.

It can be mathematically shown that the above system of n equations and k unknown polynomials, i.e. $m_1, m_2, \ldots, m_k$, can be divided into:

k required equations to find the k unknown polynomials $m_1, m_2, \ldots, m_k$ by an algebraic decoding. For instance $$c_1 = g_{11}m_1 + g_{12}m_2 + \ldots + g_{1k}m_k \quad m_1 = p_{11}c_1 + p_{12}c_2 + \ldots + p_{1k}c_k$$
$$c_2 = g_{21}m_1 + g_{22}m_2 + \ldots + g_{2k}m_k \rightarrow m_2 = p_{21}c_1 + p_{22}c_2 + \ldots + p_{2k}c_k$$
$$\ldots \quad \ldots$$
$$c_k = g_{k1}m_1 + g_{k2}m_2 + \ldots + g_{kk}m_k \quad m_k = p_{k1}c_1 + p_{k2}c_2 + \ldots + p_{kk}c_k$$

where the polynomials $p_{ij}$ are linear combinations of the generator polynomials.

n–k "control equations", independent on $m_1, m_2, \ldots, m_k$:

$$c_1 h_{11} + c_2 h_{21} + \ldots + c_n h_{n1} = 0$$
$$c_1 h_{12} + c_2 h_{22} + \ldots + c_n h_{n2} = 0$$
$$\ldots$$
$$c_1 h_{1,n-k} + c_2 h_{22} + \ldots + c_n h_{n,n-k} = 0$$

where the polynomials $h_{ij}$ are linear combinations of the generator polynomials. Examples of polynomials $h_{ij}$ are provided in annex 1. These n–k control equations can be expressed with one matrix equation. This equation is referred to as "control equation" in the following:

$$CH^t = 0, \; C^t = \begin{pmatrix} c_1 \\ c_2 \\ \cdot \\ \cdot \\ c_n \end{pmatrix}, H^t = \begin{pmatrix} h_{11} h_{12} & \ldots & h_{1,n-k} \\ h_{21} h_{22} & \ldots & h_{2,n-k} \\ & & \\ & & \\ h_{n1} h_{n2} & \ldots & h_{n,n-k} \end{pmatrix}$$

It can be theoretically show that there is at least one matrix H such as:

C is a code word $\Leftrightarrow CH^t=0$

H or H' is commonly referred to as parity-check matrix.

For complexity reason (cf annex 2), it is preferable to choose parity check matrix with minimal degree. Let us call $q_{ik}$ the degree of the polynomial $k_{ik}(x)$; if the generating polynomials verify the following property:

$\{g_{ij}(x); 1 \leq i \leq N\}$ have no common factor for all $j$. (1)

Then it can be shown that there exists a set of polynomials $\{h_{ik}\}$ such as $$\sum_{k=1}^{N-K} q_k = M - 1 \text{ where } q_k = \underset{1 \leq i \leq N}{\text{Max}}(q_{ik})$$

and M is the constraint length of the code (maximal length of the generating polynomials). These polynomials are found by searching the polynomials $h_{ik}(x)$ with minimal degree witch verify the system $H(x) \cdot G'(x)=0$.

It is to be noted that if property (1) is not verified for one column j, it is possible to achieve a code with a minimal memory by dividing this column by the Highest Common Factor of the polynomials $\{g_{ij}(x); 1 \leq i \leq N\}$.

The control equation is used to estimate the error vectors. Let $E^t=(e'_1, \ldots, e'_n)^t$ the total error estimation vector and $R=(r_1, \ldots, r_n)^t$ the total information message vector.

Figure 2:
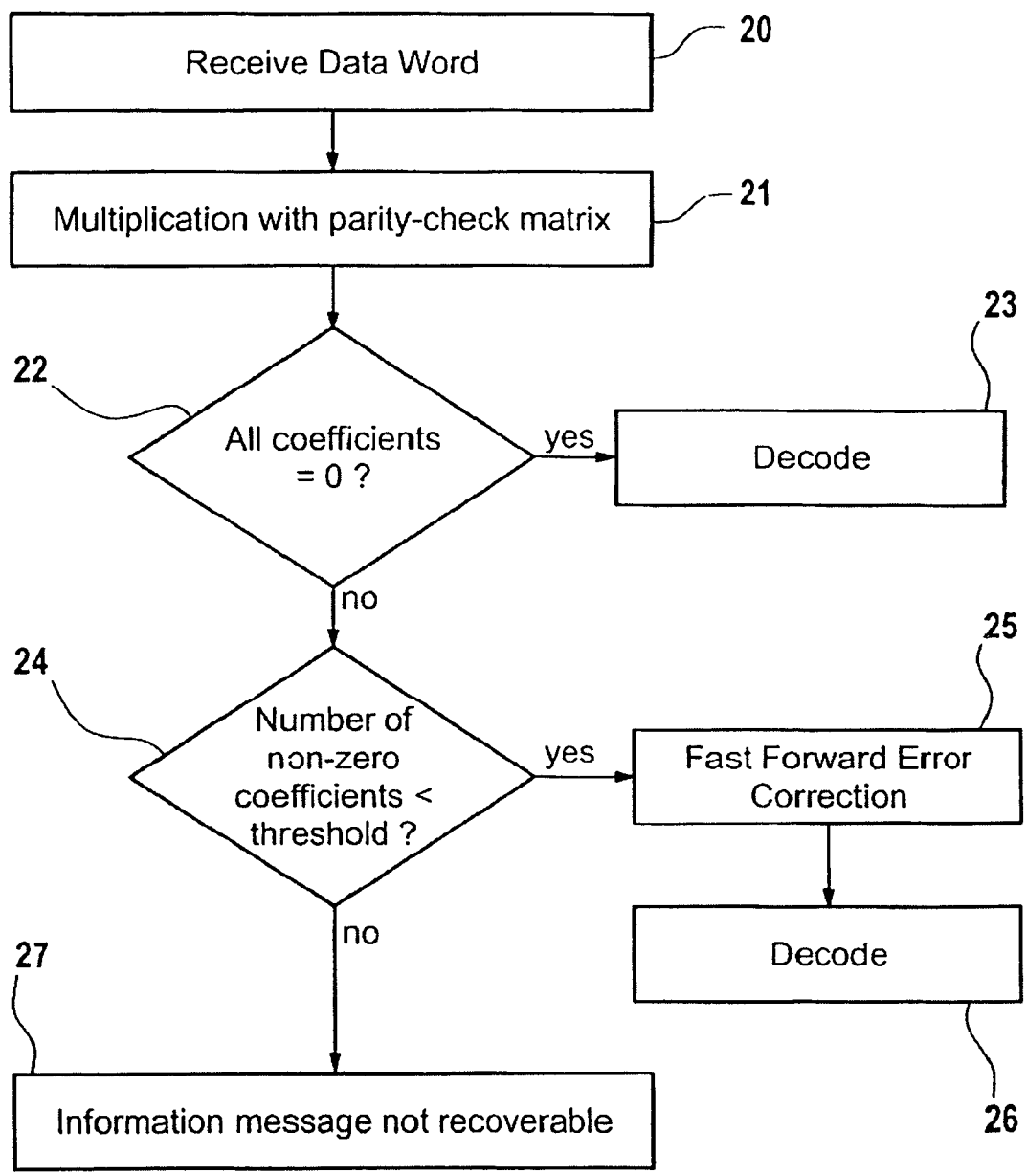
FIG. 2 is illustrative of a flow chart showing an embodiment of a method of the invention.

The corresponding decoding method is illustrated in FIG. 2 by way of example:

In step 20 a data word is received by the receiver. In step 21 the data word is multiplied by the parity-check matrix. In step 22 it is determined whether all coefficients of the result of the multiplication are equal to zero. If this is the case the control goes to step 23 where the received data word is decoded without error correction.

Otherwise the control goes to step 24 where it is determined whether the number of non-zero coefficients of the result of the multiplication is below a predefined threshold level. If this is the case an error correction of the received data word is performed in step 25 in order to eliminate the error vector. Next the error corrected data word is decoded in step 26.

If it is determined in step 24, that the number of non-zero coefficients of the results of the multiplication is above a predefined threshold level the control goes to step 27 where it is decided that the data word is uncorrectable.

This method implements the algorithm as illustrated below:
1. calculate $RH^t$
2. if the number of non null coefficients of $RH^t$ is superior to a predetermined threshold reject the frame, go to 4.
   else
   if $RH^t$ is null:

$E'=0$, go to 3.

else
   use the fast Forward Error Correction algorithm described in annex 2 to find E' such as:
   1. $(R+E')H^t=0$
   2. E' has the minimal weight (maximum likelihood)
   go to 3.
3. algebraic decoding, e.g. solve a linear system to estimate the polynomials $m_1, m_2, \ldots, m_k$, for example:

$$r_1 = g_{11}m_1 + g_{12}m_2 + \ldots + g_{1k}m_k + e'_1$$

$$r_2 = g_{21}m_1 + g_{22}m_2 + \ldots + g_{2k}m_k + e'_2$$

$$\ldots$$

$$r_k = g_{k1}m_1 + g_{k2}m_2 + \ldots + g_{kk}m_k + e'_k$$

4. end

The complexity reduction is obtained at several steps:
If the estimated frame error probability (connected to the number of non-null coefficients of $RH^t$) is superior to a predetermined threshold, the frame has a very low probability to be recovered. It is rejected before the decoding.
If $RH^t$ is null, the raw bit error rate is equal to zero, or the error is undetectable, and the FEC is not performed.
When the frame has to be decoded, $RH^t$ is used to reduce the decoding complexity. The Viterbi Algorithm is applied to estimate the error vector instead of the information message (annex 2). In this case, some iteration, shown to be unnecessary, can be avoided (annex 2).

With the proposed algorithm, almost optimal performance is achievable with an order of magnitude in complexity reduction. The following figures show the complexity reduction and the performances degradation for two convolutional codes of rate ⅓ and ⅔ in both the hard decoder input case and the soft decoder input case. The complexity criteria is the percentage of "Add Compare Select (ACS)" operations performed compared to the number of ACS of the classical Viterbi. Performance criteria is the Frame Error Rate (FER) at the decoder output.

Convolutional code of rate ⅓:

$$g_{11}(x) = 1 + x^2 + x^3$$
$$g_{21}(x) = 1 + x + x^3 \quad H^t = \begin{pmatrix} x & 1+x^2 \\ 1 & 1+x^2 \\ 1+x & x \end{pmatrix}$$
$$g_{31}(x) = 1 + x + x^2 + x^3$$

$$G = (1+x^2+x^3 \quad 1+x+x^3 \quad 1+x+x^2+x^3)$$

Figure 3A:
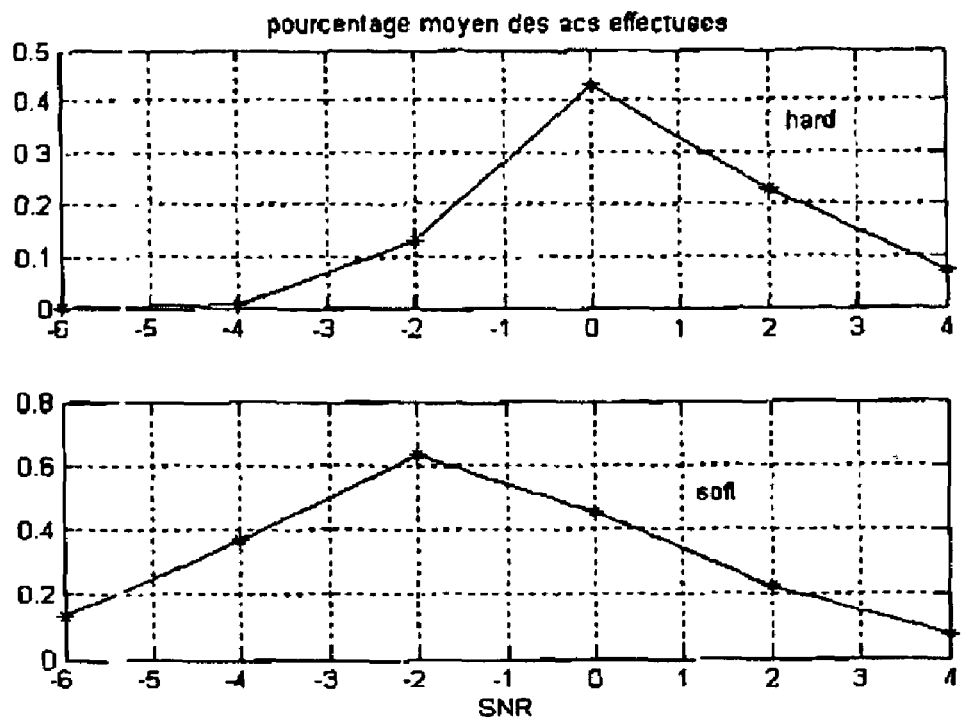
Figure 3B:
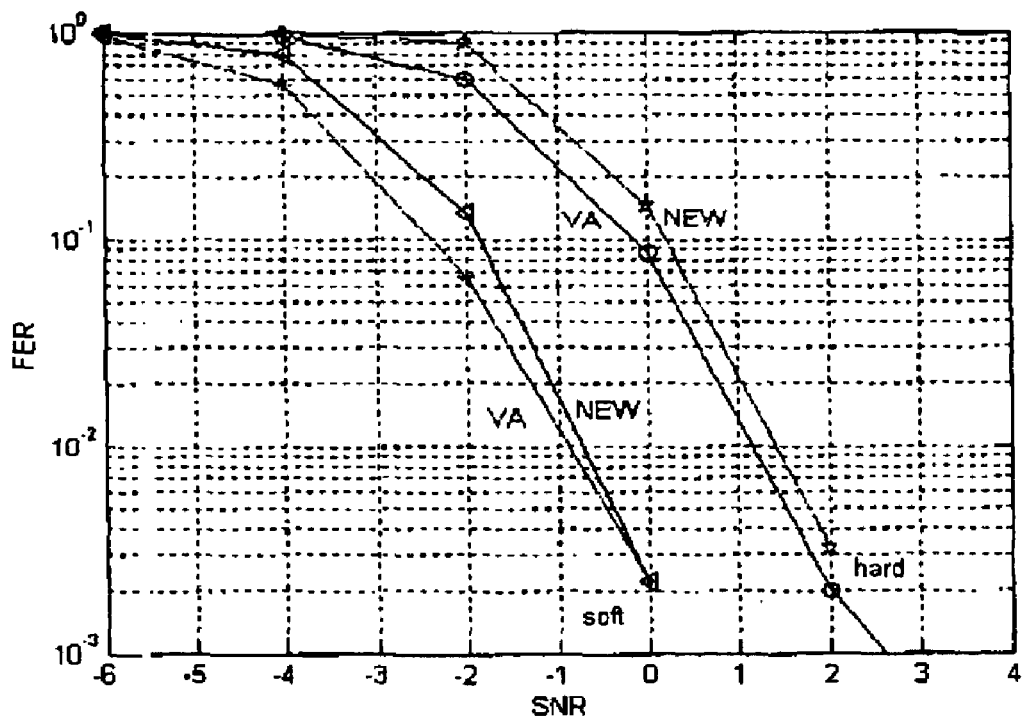

As shown in FIGS. 3A, and 3B, in both the hard and the soft cases, when the SNR is superior to 3.5 db, less than 10% of the ACS are required. Furthermore, the maximal number of required ACS remains inferior to 43% (resp. 65%) in the hard (resp. soft) case. The performances degradation remains inferior to 0.5 db in both cases.

Convolution code of rate ⅔:

$$\begin{cases} g_{11}(x) = 1 + x \\ g_{21}(x) = x \\ g_{31}(x) = 1 + x \\ g_{12}(x) = x \\ g_{22}(x) = 1 \\ g_{32}(x) = 1 \end{cases} \quad H^t = \begin{pmatrix} 1 \\ 1+x^2 \\ 1+x+x^2 \end{pmatrix} \quad G = \begin{pmatrix} 1+x & x & 1+x \\ x & 1 & 1 \end{pmatrix}$$

Figure 4A:
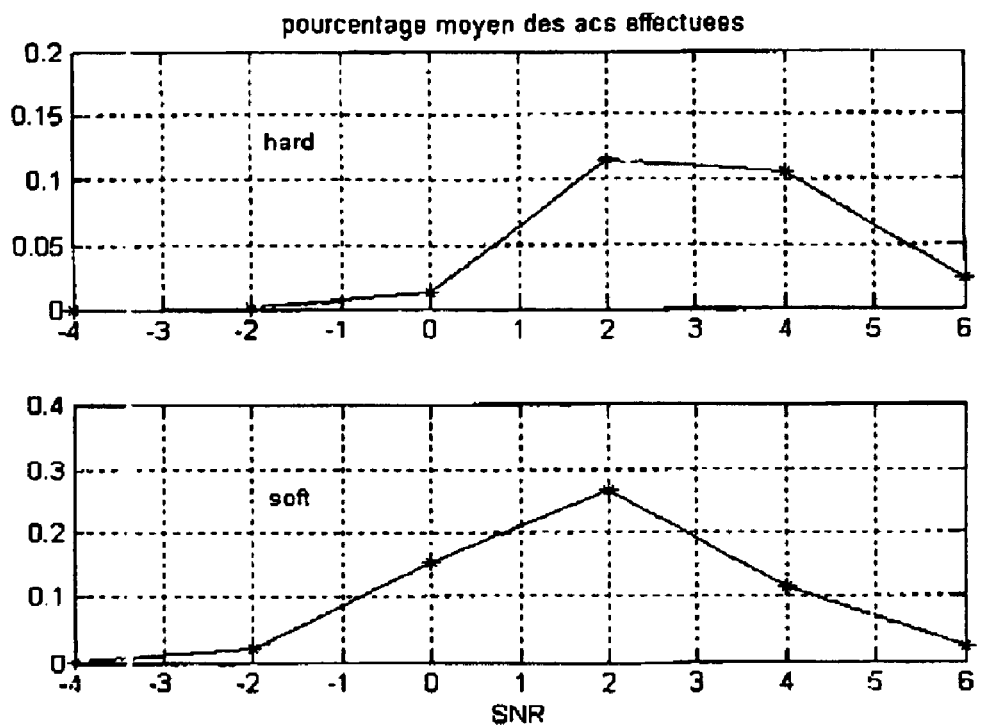
Figure 4B:
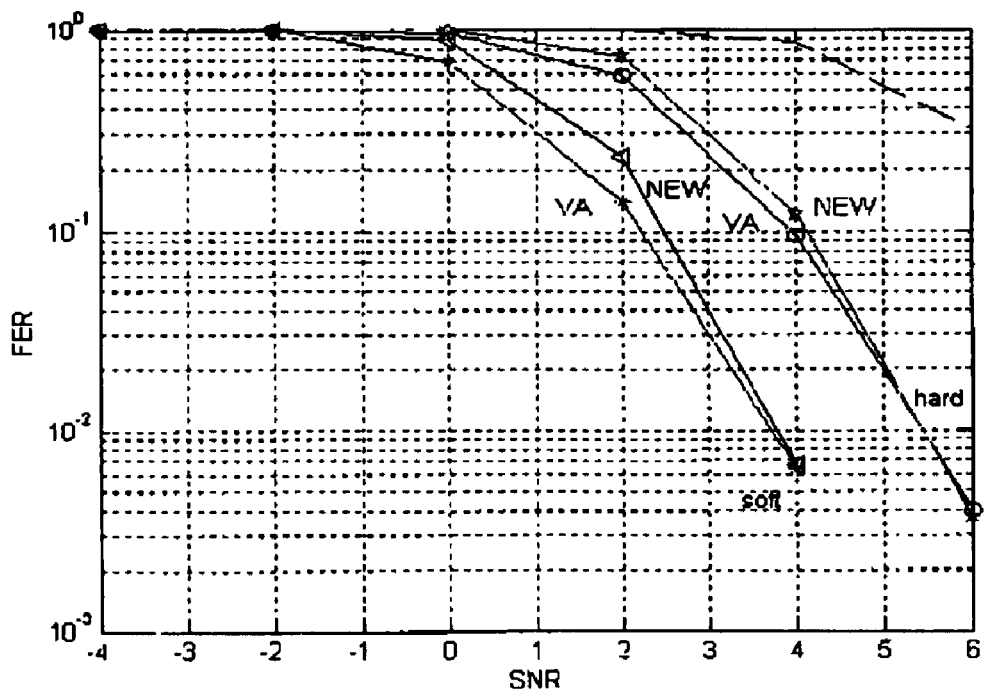

As shown in FIGS. 4A and 4B, in both the hard and the soft cases, when the SNR is superior to 4 db, less than 10% of the ACS are required. Furthermore, the maximal number of required ACS remains inferior to 12% (resp. 27%) in the hard (resp. soft) case. The performances degradation remains inferior to 0.5 db (resp. 0.3 db) in the hard (resp. soft) case.

| List of Reference Numerals | |
|---|---|
| 1 | sender |
| 2 | receiver |
| 3 | channel |
| 4 | encoder |
| 5 | decoder |
| 200 | receiver |
| 202 | program module |
| 204 | program module |
| 208 | program module |
| 209 | program module |
| 212 | program module |

Annex 1: Examples of Control Matrix

In the following a polynomial "p(X)" is called "p".
Since all the polynomials p have their coefficients in the {0,1} we always have:

$$p+p=0$$

½ convolutional codes:

$$\begin{cases} C_1 = g_1 m_1 \\ C_2 = g_2 m_1 \end{cases}$$

$$\Leftrightarrow \begin{cases} g_2 C_1 = g_2 g_1 m_1 \\ g_1 C_2 = g_1 g_2 m_1 \end{cases}$$

$$\Rightarrow g_2 C_1 + g_1 C_2 = g_2 g_1 m_1 + g_2 g_1 m_1$$

$$\Rightarrow g_2 C_1 + g_1 C_2 = 0$$

$$\boxed{CH^t = 0, \; C^t = \begin{pmatrix} C_1 \\ C_2 \end{pmatrix}, \; H^t = \begin{pmatrix} g_2 \\ g_1 \end{pmatrix}}$$

⅗ convolutional codes:

$$\begin{cases} C_1 = g_{11}m_1 + g_{12}m_2 + g_{13}m_3 \\ C_2 = g_{21}m_1 + g_{22}m_2 + g_{23}m_3 \\ C_3 = g_{31}m_1 + g_{32}m_2 + g_{33}m_3 \\ C_4 = g_{41}m_1 + g_{42}m_2 + g_{43}m_3 \\ C_5 = g_{51}m_1 + g_{52}m_2 + g_{53}m_3 \end{cases}$$

-continued $$\Leftrightarrow \begin{cases} C_1 = g_{11}m_1 + g_{12}m_2 + g_{13}m_3 \\ g_{21}C_1 + g_{11}C_2 = (g_{11}g_{22} + g_{12}g_{21})m_2 + (g_{21}g_{13} + g_{23}g_{11})m_3 \\ g_{31}C_1 + g_{11}C_3 = (g_{11}g_{32} + g_{12}g_{31})m_2 + (g_{31}g_{13} + g_{33}g_{11})m_3 \\ g_{41}C_1 + g_{11}C_4 = (g_{11}g_{42} + g_{12}g_{41})m_2 + (g_{41}g_{13} + g_{43}g_{11})m_3 \\ g_{51}C_1 + g_{51}C_3 = (g_{11}g_{52} + g_{12}g_{51})m_2 + (g_{51}g_{13} + g_{53}g_{11})m_3 \end{cases}$$

$$\Leftrightarrow \begin{cases} C_1 = G_{11}m_1 + G_{12}m_2 + G_{13}m_3 \\ g_{21}C_1 + g_{11}C_2 = G_{22}m_2 + G_{23}m_3 \\ (g_{31}C_1 + g_{11}C_3)(G_{22}) + (G_{32})(g_{21}C_1 + g_{11}C_2) = G_{33}m_3 \\ (g_{41}C_1 + g_{11}C_4)(G_{22}) + (G_{42})(g_{21}C_1 + g_{11}C_2) = G_{43}m_3 \\ (g_{51}C_1 + g_{11}C_5)(G_{22}) + (G_{52})(g_{21}C_1 + g_{11}C_2) = G_{53}m_3 \end{cases}$$

with:

$G_{11} = g_{11}; G_{12} = g_{12}; G_{12} = g_{12}$ $G_{22} = g_{11}g_{22} + g_{12}g_{21}; G_{23} = g_{21}g_{13} + g_{23}g_{11}$ $G_{32} = g_{11}g_{32} + g_{12}g_{31}; G_{42} = g_{11}g_{42} + g_{12}g_{41}; G_{52} = g_{11}g_{52} + g_{12}g_{51}$ $G_{33} = (g_{11}g_{22} + g_{12}g_{21})(g_{31}g_{13} + g_{33}g_{11}) + (g_{21}g_{13} + g_{23}g_{11})(g_{11}g_{32} + g_{12}g_{31})$ $G_{43} = (g_{11}g_{22} + g_{12}g_{21})(g_{41}g_{13} + g_{43}g_{11}) + (g_{21}g_{13} + g_{23}g_{11})(g_{11}g_{42} + g_{12}g_{41})$ $G_{53} = (g_{11}g_{22} + g_{12}g_{21})(g_{51}g_{13} + g_{53}g_{11}) + (g_{21}g_{13} + g_{23}g_{11})(g_{11}g_{52} + g_{12}g_{51})$ $$\Leftrightarrow \begin{cases} C_1 = G_{11}m_1 + G_{12}m_2 + G_{13}m_3 \\ g_{21}C_1 + g_{11}C_2 = G_{22}m_2 + G_{23}m_3 \\ (g_{31}C_1 + g_{11}C_3)(G_{22}) + (G_{32})(g_{21}C_1 + g_{11}C_2) = G_{33}m_3 \\ ((g_{41}C_1 + g_{11}C_4)(G_{22}) + (G_{42})(g_{21}C_1 + g_{11}C_2))G_{33} + ((g_{31}C_1 + g_{11}C_3)(G_{22}) + (G_{32})(g_{21}C_1 + g_{11}C_2))G_{43} = 0 \\ ((g_{51}C_1 + g_{11}C_5)(G_{22}) + (G_{52})(g_{21}C_1 + g_{11}C_2))G_{33} + ((g_{31}C_1 + g_{11}C_3)(G_{22}) + (G_{32})(g_{21}C_1 + g_{11}C_2))G_{53} = 0 \end{cases}$$

$$\Rightarrow \begin{cases} ((g_{41}G_{22} + g_{21}G_{42})G_{33} + (g_{31}G_{22} + g_{21}G_{32})G_{43})C_1 + (g_{11}G_{42}G_{33} + g_{11}G_{32}G_{43})C_2 + (g_{11}G_{22}G_{43})C_3 + (g_{11}G_{22}G_{33})C_4 + (0)C_5 = 0 \\ ((g_{51}G_{22} + g_{21}G_{52})G_{33} + (g_{31}G_{22} + g_{21}G_{52})G_{53})C_1 + (g_{11}G_{52}G_{33} + g_{11}G_{32}G_{53})C_2 + (g_{11}G_{22}G_{53})C_3 + (0)C_4 + (g_{11}G_{22}G_{33})C_5 = 0 \end{cases}$$

$$\boxed{\begin{aligned} CH^t &= 0 \\ H &= \begin{pmatrix} (g_{41}G_{22} + g_{21}G_{42})G_{33} + (g_{31}G_{22} + g_{21}G_{32})G_{43} & g_{11}G_{42}G_{33} + g_{11}G_{32}G_{43} & g_{11}G_{22}G_{43} & g_{11}G_{22}G_{33} & 0 \\ (g_{51}G_{22} + g_{21}G_{52})G_{33} + (g_{31}G_{22} + g_{21}G_{52})G_{53} & g_{11}G_{52}G_{33} + g_{11}G_{32}G_{53} & g_{11}G_{22}G_{53} & 0 & g_{11}G_{22}G_{33} \end{pmatrix} \\ C &= (C_1 \quad C_2 \quad C_3 \quad C_4 \quad C_5) \end{aligned}}$$

Annex 2: Fast Forward Error Correction (Hard Decoder Input Case)

We hove to find the $$e'(x) = \sum_{i=1}^{N} x^{i-1} e'_1(x^N)$$

word with minimal weight such as $$H(x) \cdot \begin{pmatrix} r_1(x) + e'_1(x) \\ \cdots \\ r_N(x) + e'_N(x) \end{pmatrix}$$

is null. We can mathematically show the following equivalence:

$$H(x) \cdot \begin{pmatrix} r_1(x) + e'_1(x) \\ \cdots \\ \cdots \\ r_N(x) + e'_N(x) \end{pmatrix} = E(x) = \begin{pmatrix} 0 \\ \cdots \\ 0 \end{pmatrix} \Leftrightarrow r(x) + e'(x)$$

is a codeword with $$E(x) = \begin{pmatrix} E_1(x) \\ \cdots \\ E_{N-K}(x) \end{pmatrix}$$

The search of e'(x) can be done by using the Viterbi Algorithm to cancel the matrix E(x)

$$E_j(x) = \sum_i E_{j,i} x^i; \quad 1 \le j \le N - K$$

The trellis used in the Viterbi Algorithm is constituted of nodes corresponding to distinct states. These nodes are connected by branches. A succession of branches is called a path and a path is characterized by a metric.

States

There are $2^{M-1}$ states, where M−1 is the memory of the code. A matrix $E^{S_k}(x)$ is associated with each state $S_k$. The value of the state $S_k$ at time n is given by the M−1 elements of the matrix $E^{S_k}(x)$ as follows:

$$E_j^{S_k}(x) = \sum_i E_{j,i}^{S_k} x^i; \quad 1 \le j \le N - K$$

-continued $$S_k = \{ V_1 \quad V_2 \quad \ldots \quad V_{N-K} \} \text{ with}$$

$$\begin{cases} V_j = \{E_{j,n}^{S_k}, E_{j,n+1}^{S_k}, \ldots, E_{j,n+Mj-2}^{S_k}\} \\ Mj = \max_i (\text{degree of } hij) \end{cases}$$

The initial state $S_{k,0}$ is associated to E(x).

Branches

A branch represents the transition between one state at time n (current state) and one state at time n+1 (following state). Let us call:

$e'_{i,n}$: coefficient n of $e'_i$

A set of coefficient $$\{e'_{1,n}, \ldots, e'_{N,n}\}$$

is associated to each branch. At time n, one builds the set $\{Z_i(x)\}$ of sequences $$Z_i(x) = H(x) \cdot \begin{pmatrix} e'_{1,n} \\ \ldots \\ \ldots \\ e'_{N,n} \end{pmatrix} x^n = \begin{pmatrix} Z_{1,i} \\ \ldots \\ Z_{N-K,i} \end{pmatrix} \text{ with } Z_{j,i}(x) = \sum_{l=0}^{Mj-1} Z_{j,i}^l x^{n+l};$$

$$1 \leq i \leq 2^n$$

where the first coefficient $Z_{j,i}^0$ satisfies the condition:

$$Z_{j,i}^0 = E_{j,n}^{S_k} \text{ for } 1 \leq j \leq N-K$$

Let $S_k$ be the current state at time n, let $S_i$ be $S_k$ following state (at time n+1) and let $E^{S_i}$ be the associated polynomial. We have:

$$E_j^{S_i}(x) = E_j^{S_k}(x) + Z_{j,i}(x) \text{ for } 1 \leq j \leq N-K$$

$$S_i = \{V_1 V_2 \ldots V_{N-K}\} \text{ with } \begin{cases} V_j = \{E_{j,n}^{S_k} + Z_{j,1}^i, E_{j,n+1}^{S_k} + Z_{j,2}^i, \ldots, \\ \qquad E_{j,n+Mj-2}^{S_k} + Z_{j,Mj-1}^i\} \\ Mj = \max_i (\text{degree of } hij) \end{cases}$$

This procedure leads to an iterative cancellation of the matrix $E^S s\ k$.

Metrics

The principle of the proposed decoding technique is to find the sequence e'(x) of minimum weight which cancels the matrix E(x). It leads to define the branch metric at time n by:

$$\Delta(n) = \sum_{i=1}^{N} e'_{i,n}$$

Remark: in the soft case we have $$\Delta(n) = \sum_{i=1}^{N} |R_{i,n}| e'_{i,n}$$

where the $R_{i,n}$ are the received soft symbols. The path metric mk(n) is the accumulation of the branch metrics. When several paths come to the same state, the survivor is the one with the smallest path metric. At the end of the procedure, the survivor path is the one terminating in the state S0={0 0 ... 0}, which is the unique state having all the elements of $E^{S_k}(x)$ to be null. All the set $\{e_{1,n}', \ldots, e_{N,n}'\}$ associated to each branch of the survivor constitute the decoded error vector e'(x).

$$e'(x) = \sum_n \left( \sum_{i=1}^{N} x^{i-1} e'_{i,n} \right) x^{Nn}$$

"FEC Useless" Zone

If at one step denoted $n_0$ the properties (P1) and (P2) are both satisfied, then it is unnecessary to carry on the Viterbi Algorithm. The survivor path is the one which reaches the state S0={0 0 ... 0} at the iteration $n_0$ and which remains in this state S0 after this node.

$$E^{S0}(x) = \{0, 0, \ldots, 0\} \text{ for all } j\ 1 \leq j \leq N-K \quad (P1)$$

$$m_k(n_0) \geq m_0(n_0) \text{ for } k \neq 0 \quad (P2)$$

Furthermore, let us assume that, at time n−n1, condition (P2) is satisfied and that all the vectors $E_j^{S_k}(x)$ verify:

$$\{E_{j,0}^{S_k}, E_{j,1}^{S_k}, \ldots, E_{j,n-n1-1}^{S_k}\} = \{0, 0, \ldots, 0\}$$

$$\{E_{j,n-n1}^{S_k}, E_{j,n-n1+1}^{S_k}, \ldots, E_{j,n-n1+Mj-2}^{S_k}\} = V_j$$

$$\{E_{j,n-n1+Mj-1}^{S_k}, E_{j,n-n1+Mj}^{S_k}, \ldots, E_{j,n}^{S_k}\} = \{0, 0, \ldots, 0\}$$

$$E_{j,n+1}^{S_k} = 1$$

This configuration can occur if there are at least n1 successive zeros in E(x). Then we can theoretically show that it is unnecessary to carry on the Viterbi Algorithm between step n−n1 and n−M+1 if n1 is superior to a certain threshold which depends on the coder. The Viterbi Algorithm is restarted at step n−M+1 with $S_0$ as initial state.

Remark: in the soft case the Viterbi algorithm has to be restarted at step n−A+1 where the choice of A results from a trade-off between complexity reduction and performances degradation.

Final Estimation

The final decoded information sequence m'(x) is given by an algebraic decoding of the codeword r(x)+e'(x).

Annex 3: Proof
Convolutional codes of rate ½:
m(x): information word
$g_1(x), g_2(x)$ generator polynomials
$C_1(x) = m(x) \cdot g_1(x)$: code-word from polynomial g1,
$C_2(x) = m(X) \cdot g_2(x)$: code-word from polynomial g2,
$r_1(x) = C_1(x) + e_1(x)$: received word 1,
$r_2(x) = C_2(x) + e_2(x)$: received word 2.

Using the Parity Check Matrix:
Minimal Parity check Matrix:

$$H^t = \begin{pmatrix} g_2 \\ g_1 \end{pmatrix}$$

For any code word $$C^t = \begin{pmatrix} C_1 \\ C_2 \end{pmatrix}$$

we have: $CH^t = 0$
If we call $R^t = (r_1 \ r_2)$ the total received data word we have:

$$R.H^t = (r_1 \ r_2) \begin{pmatrix} g_2 \\ g_1 \end{pmatrix}$$

$$R.H^t = (C_1 + e_1 \ \ C_2 + e_2) \begin{pmatrix} g_2 \\ g_1 \end{pmatrix}$$

$$R.H^t = 0 + e_1 g_2 + e_2 g_1$$

$$\boxed{R.H^t(x) = e_1(x) g_2(x) + e_2(x) g_1(x)}$$

Using Simple Polynomial Manipulations: . . .
We call G the equivalent generator polynomial and C the total resulting code word defined by:

$G(x) = g_1(x^2) + x \cdot g_2(x^2)$ $C(x) = C_1(x^2) + x \cdot C_2(x^2) = m(x^2) \cdot G(x)$ We can show that $C(x)G(x)$ is an even polynomial:

$C(x) \cdot G(x) = m(x^2) \cdot G(x) \cdot G(x) = m(x^2) \cdot G(x^2)$ if we call $e(x)$ the error polynomial and $r(x)$ the received polynomial defined by $e(x) = e_1(x^2) + x \cdot e_2(x^2)$ $r(x) = C(x) + e(x)$ we have:

$r(x) \cdot G(x) = C(x) \cdot G(x) + e(x) \cdot G(x)$ $r(x) \cdot G(x) = C(x) \cdot G(x) + e_1(x^2) \cdot g^1(x^2) + x^2 \cdot e_2(x^2) \cdot g_2(x^2) + x19 \ (e_1(x^2) \cdot g_2(x^2) + e_2(x^2) \cdot g_1(x^2))$ Therefore:

Odd $\{r(x) \cdot G(x)\} = e_1(x^2) \cdot g_2(x^2) + e_2(x^2) \cdot g_1(x^2)$ => same coefficient than $R \cdot H^t$ Finally, the odd part of the polynomial $r(x) \cdot G(x)$ has the same coefficient than the results of the received data word multiplied by the parity check matrix.

The invention claimed is:

1. A method of decoding a received data word having been transmitted over a radio communication channel, corresponding sent information message having been encoded as a code word, the method comprising:
   multiplying of the received data word by a parity-check matrix;
   if the result of the multiplication is zero, performing an algebraic decoding of the received data word without error correction;
   if the result of the multiplication is not zero, determining whether the received data word is unrecoverable based on a threshold; and
   storing the decoded received data word.

2. The method of claim 1, further comprising in case the result of the multiplication is not equal to zero: performing an error correction by estimating the transmission error, subtracting the estimated error from the received data word, and performing an algebraic decoding of the result of the subtraction.

3. The method of claim 2, wherein the error correction is performed by using a Viterbi type method to find the error such as:
   $(R+E') H^t = 0$, and
   E' has the minimal weight,
   where E' is the total error estimation vector, R is the total information message vector, and H is the parity-check matrix.

4. The method of claim 3, wherein $R \cdot H'$ is used to identify an approximate location of potential errors and the Viterbi algorithm is only applied for these locations, thus avoiding iterations in error-free areas.

5. The method of claim 1, wherein the received data word is determined to be unrecoverable in case number of non-null coefficients of the result of the multiplication exceeds a threshold level.

6. The method of claim 1, wherein a set of polynomials $\{h_{ik}\}$ is determined by searching the polynomials $h_{ik}(x)$ with minimal degree which verify the system $H(x) \cdot G'(x) = 0$, and wherein
   G is the generator matrix which consists of the generator polynomials $g_{ij}$,
   $\{g_{ij}(x); 1 \leq i \leq N\}$ have no common factor for all j,
   $q_{ik}$ is the degree of the polynomial $h_{ik}(x)$;
   the polynomials $h_{ik}(x)$ are linear combinations of generator polynomials $g_{ij}$, and $$\sum_{k=1}^{N-K} q_k = M - 1 \text{ where } q_k = \underset{1 \leq i \leq N}{\text{Max}}(q_{ik})$$

and M is the constraint length of the code.

7. The method of claim 1, wherein a convolutional code rate is k/n, where n and k are arbitrary integer numbers.

8. The method of claim 1, wherein a convolutional code rate is ½ and the result of received data word multiplied by the parity check matrix is obtained by calculating the odd part of $r(x) \cdot G(x)$, where:
   m(x): information word,
   $g_1(x), g_2(x)$: generator polynomials,
   $G(x) = g_1(x^2) + x \cdot g_2(x^2)$: equivalent generator polynomial,
   $C_1(x) = m(x) \cdot g_2(x)$: code-word from polynomial g1,
   $C_2(x) = m(X) \cdot g_2(x)$: code-word from polynomial g2,
   $r_1(x) = C_1(x) + e_1(x)$: received word 1, $r_2(x)=C_2(x)+e_2(x)$: received word 2, and $r(x)=r_1(x^2)+x \cdot r_2(x^2)$: received polynomial.

9. A computer readable-medium storing instructions for decoding a received data word having been transmitted over a radio communication channel, the corresponding sent data word having been encoded as a code word, the instructions comprising:

multiplying of the received data word by a parity-check matrix, if the result of the multiplication is zero, performing an algebraic decoding of the received data word without error correction; and if the result of the multiplication is not zero, determining whether the received data word is unrecoverable based on a threshold.

10. A receiver of a radio communication network comprising means for decoding a received data word having been transmitted over a radio communication channel, the corresponding sent data word having been encoded as a code word, and error correction means, the means for decoding being adapted to perform the steps of:

multiplying of the received data word by a parity-check matrix;

if the result of the multiplication is zero: performing an algebraic decoding of the received data word without error correction; and if the result of the multiplication is not zero, determining whether the received data word is unrecoverable based on a threshold.

11. The method of claim 1, further comprising when the result of the multiplication is not equal to zero, performing an error correction prior to the decoding.

12. The computer readable medium of claim 9, wherein the instructions further comprise: when the result of the multiplication is not equal to zero, performing an error correction prior to the decoding.

13. The receiver of claim 10, wherein, when the result of the multiplication is not equal to zero, the error correction means performs an error correction prior to the decoding.

14. The computer-readable medium of claim 9, wherein the instructions further comprise if the result of the multiplication is not equal to zero, performing an error correction by estimating the transmission error, subtracting the estimated error from the received data word, and performing an algebraic decoding of the result of the subtraction.

15. The computer-readable medium of claim 9, wherein the received data word is determined to be unrecoverable in case number of non-null coefficients of the result of the multiplication exceeds a threshold level.

16. The computer-readable medium of claim 9, wherein a convolutional code rate is k/n, where n and k are arbitrary integer numbers.

17. The receiver of claim 10, wherein, if the result of the multiplication is not equal to zero, the error correction means performs an error correction by estimating the transmission error, and subtracts the estimated error from the received data word, and the decoding means performs an algebraic decoding of the result of the subtraction.

18. The receiver of claim 10, wherein the received data word is determined to be unrecoverable in case number of non-null coefficients of the result of the multiplication exceeds a threshold level.

19. The receiver of claim 10, wherein a convolutional code rate is k/n, where n and k are arbitrary integer numbers.

20. A method of decoding a received data word having been transmitted over a radio communication channel, corresponding sent information message having been encoded as a code word, the method comprising:

multiplying of the received data word by a parity-check matrix;

if the result of the multiplication is zero, performing an algebraic decoding of the received data word without error correction;

if the result of the multiplication is not zero, determining whether the received data word is unrecoverable from a number of coefficients obtained from the multiplication; and storing the decoded received data word.

* * * * *